United States Patent
Kwon et al.

(10) Patent No.: US 9,065,504 B2
(45) Date of Patent: Jun. 23, 2015

(54) TRANSMITTER FRONT END WITH PROGRAMMABLE NOTCH FILTER AND METHODS FOR USE THEREWITH

(75) Inventors: Dae Kwon, San Diego, CA (US); Ali Afsahi, San Diego, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 225 days.

(21) Appl. No.: 13/329,300

(22) Filed: Dec. 18, 2011

(65) Prior Publication Data

US 2013/0109334 A1 May 2, 2013

Related U.S. Application Data

(60) Provisional application No. 61/552,835, filed on Oct. 28, 2011.

(51) Int. Cl.
*H04B 1/04* (2006.01)

(52) U.S. Cl.
CPC ...... *H04B 1/0475* (2013.01); *H04B 2001/0433* (2013.01)

(58) Field of Classification Search
USPC .............. 455/69, 126, 114.2, 114.3, 455/115.1–115.4; 333/165, 17.1, 176, 209; 327/556, 237
See application file for complete search history.

(56) References Cited

U.S. PATENT DOCUMENTS

| | | | |
|---|---|---|---|
| 3,895,304 A * | 7/1975 | Klein | 327/556 |
| 6,212,367 B1 * | 4/2001 | Tolson | 455/114.2 |
| 6,321,068 B1 * | 11/2001 | Zamat | 455/69 |
| 7,761,067 B1 * | 7/2010 | Tsai et al. | 455/127.2 |
| 8,682,260 B1 * | 3/2014 | Granger-Jones et al. | 455/77 |
| 2010/0142605 A1 | 6/2010 | Chamberlain | |
| 2010/0164648 A1 * | 7/2010 | Kravitz et al. | 333/165 |
| 2012/0286892 A1 * | 11/2012 | Gu et al. | 333/17.1 |

FOREIGN PATENT DOCUMENTS

| | | |
|---|---|---|
| CN | 1230089 | 9/1999 |
| CN | 202906899 | 4/2013 |
| WO | 02071599 A1 | 9/2002 |
| WO | 2011046814 A2 | 4/2011 |

OTHER PUBLICATIONS

European Search Report; EP Application No. 12007182.4; Mar. 21, 2013; 3 pages.

* cited by examiner

*Primary Examiner* — Junpeng Chen
(74) *Attorney, Agent, or Firm* — Garlick & Markison; Bruce E. Stuckman

(57) ABSTRACT

A radio transmitter front end for use in a radio frequency (RF) transceiver includes at least one amplifier stage operable to generate a transmit signal in response to an upconverted signal. A feedback generator is operable to generate a transmit feedback signal in response to the transmit signal. A control signal generator is operable to generate at least one filter control signal in response to the transmit feedback signal. A notch filter is operable to filter out of band noise while passing in-band frequencies to the at least one amplifier stage, under control of the at least one filter control signal.

20 Claims, 10 Drawing Sheets

TRANSMITTER FRONT END WITH PROGRAMMABLE NOTCH FILTER AND METHODS FOR USE THEREWITH

CROSS REFERENCE TO RELATED PATENTS

The present application claims priority based on 35 U.S.C. §119 to the provisionally filed application entitled, LOCAL AREA NETWORK TRANSCEIVER AND METHODS FOR USE THEREWITH, having Ser. No. 61/552,835, filed on Oct. 10, 2011, the contents of which are incorporated herein for any and all purposes, by reference thereto.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to wireless communication and more particularly to antennas used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, wireless communications occur within licensed or unlicensed frequency spectrums. For example, wireless local area network (WLAN) communications occur within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain. Another unlicensed frequency spectrum is the V-band of 55-64 GHz.

Other disadvantages of conventional approaches will be evident to one skilled in the art when presented the disclosure that follows.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
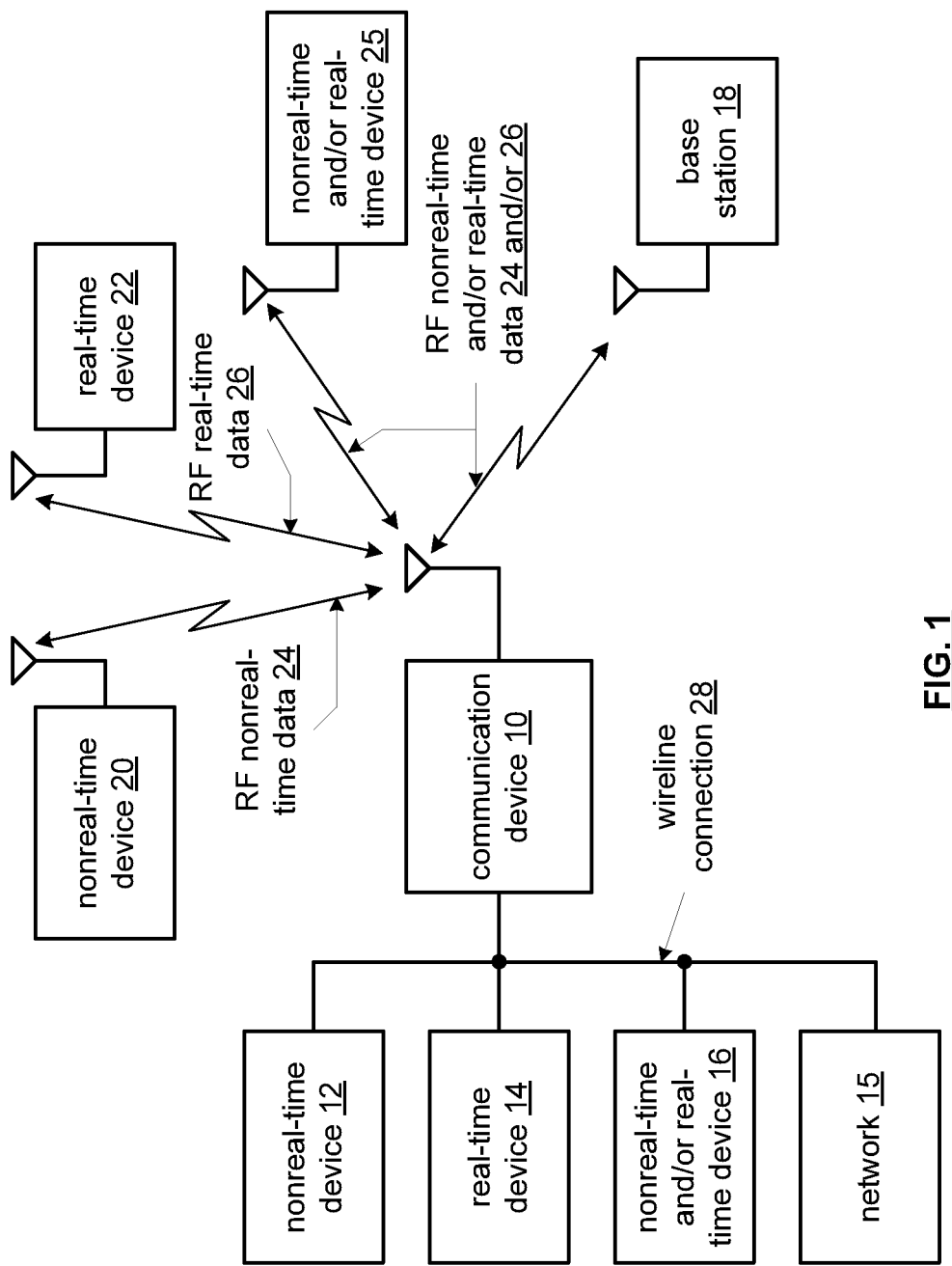
FIG. 1 is a schematic block diagram of an embodiment of a wireless communication system in accordance with the present invention.

FIG. 1 is a schematic block diagram of an embodiment of a communication system in accordance with the present invention. In particular a communication system is shown that includes a communication device 10 that communicates real-time data 26 and/or non-real-time data 24 wirelessly with one or more other devices such as base station 18, non-real-time device 20, real-time device 22, and non-real-time and/or real-time device 25. In addition, communication device 10 can also optionally communicate over a wireline connection with network 15, non-real-time device 12, real-time device 14, non-real-time and/or real-time device 16.

In an embodiment of the present invention the wireline connection 28 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 10.

Communication device 10 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 28 and/or the wireless communication path. Further communication device 10 can be an access point, base station or other network access device that is coupled to a network 15 such at the Internet or other wide area network, either public or private, via wireline connection 28. In an embodiment of the present invention, the real-time and non-real-time devices 12, 14 16, 20, 22 and 25 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 26 includes voice, audio, video and multimedia applications including Internet gaming, etc. The non-real-time data 24 includes text messaging, email, web browsing, file uploading and downloading, etc.

In an embodiment of the present invention, the communication device 10 includes a wireless transceiver that includes one or more features or functions of the present invention. Such wireless transceivers shall be described in greater detail in association with FIGS. 3-11 that follow.

Figure 2:
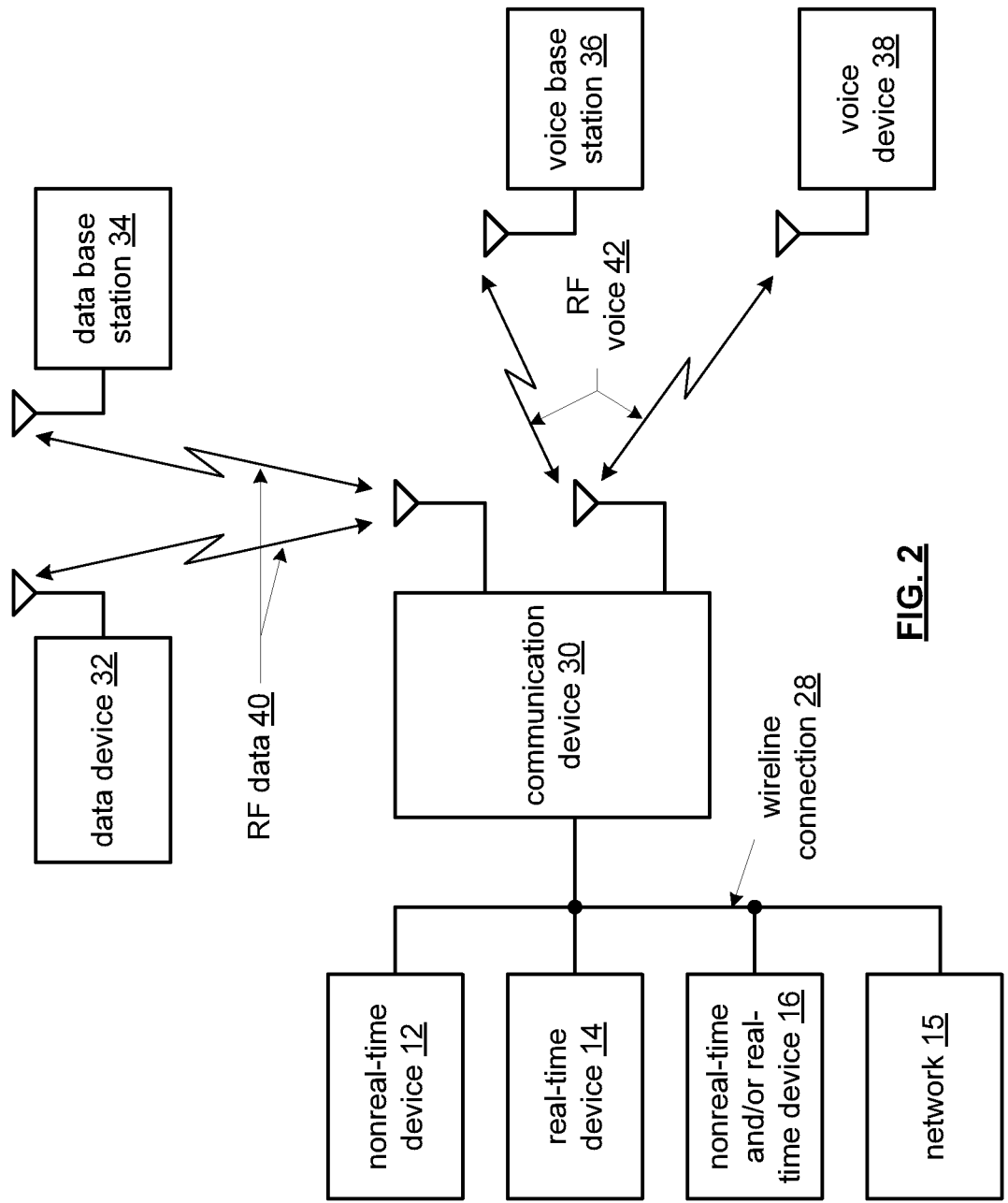
FIG. 2 is a schematic block diagram of another embodiment of a wireless communication system in accordance with the present invention.

FIG. 2 is a schematic block diagram of an embodiment of another communication system in accordance with the present invention. In particular, FIG. 2 presents a communication system that includes many common elements of FIG. 1 that are referred to by common reference numerals. Communication device 30 is similar to communication device 10 and is capable of any of the applications, functions and features attributed to communication device 10, as discussed in conjunction with FIG. 1. However, communication device 30 includes two or more separate wireless transceivers for communicating, contemporaneously, via two or more wireless communication protocols with data device 32 and/or data base station 34 via RF data 40 and voice base station 36 and/or voice device 38 via RF voice signals 42.

Figure 3:
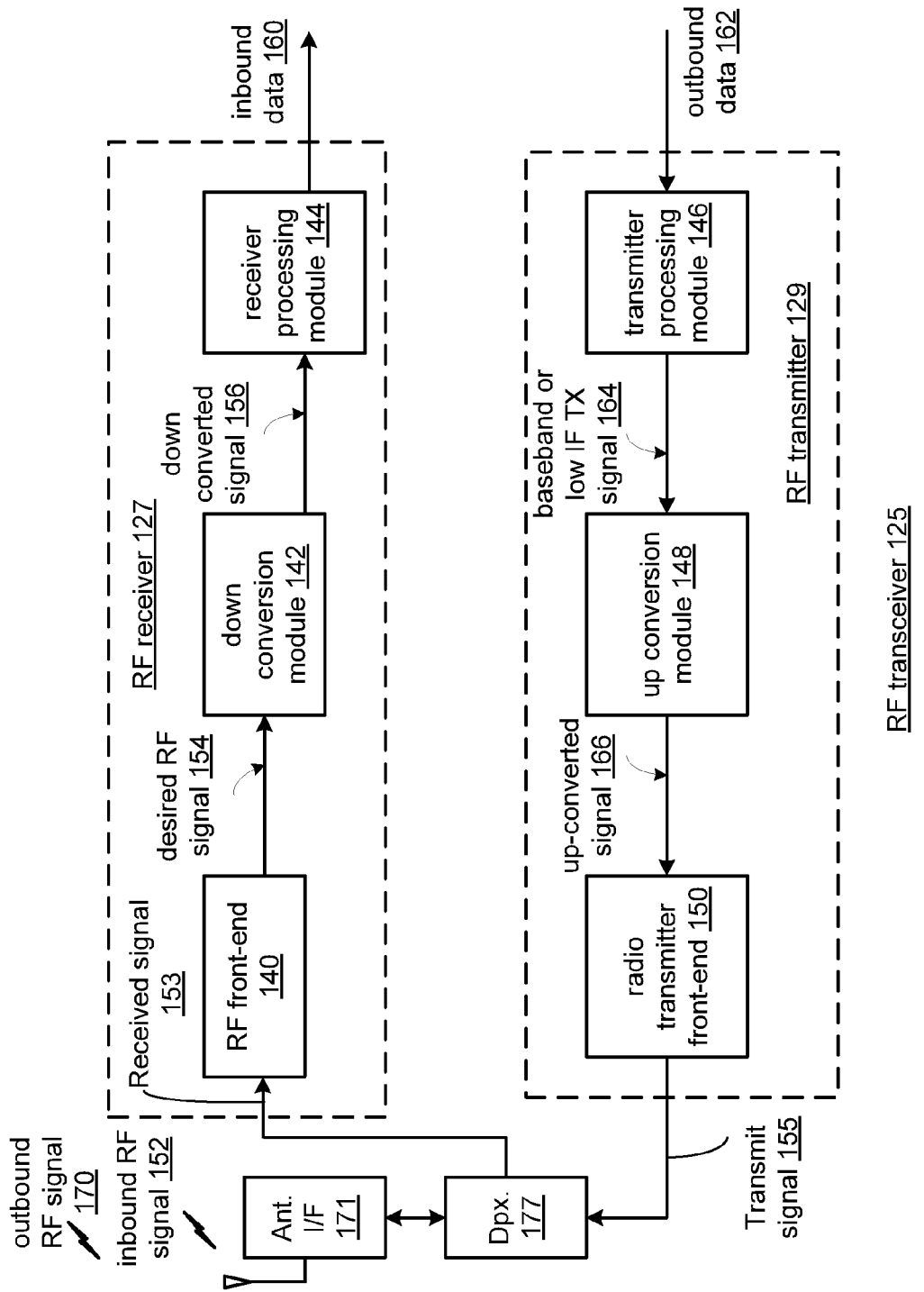
FIG. 3 is a schematic block diagram of an embodiment of a wireless transceiver 125 in accordance with the present invention.

FIG. 3 is a schematic block diagram of an embodiment of a wireless transceiver 125 in accordance with the present invention. The RF transceiver 125 represents a wireless transceiver for use in conjunction with communication devices 10 or 30, base station 18, non-real-time device 20, real-time device 22, and non-real-time, real-time device 25, data device 32 and/or data base station 34, and voice base station 36 and/or voice device 38. RF transceiver 125 includes an RF transmitter 129, and an RF receiver 127. The RF receiver 127 includes a RF front end 140, a down conversion module 142 and a receiver processing module 144. The RF transmitter 129 includes a transmitter processing module 146, an up conversion module 148, and a radio transmitter front-end 150.

As shown, the receiver and transmitter are each coupled to an antenna through an antenna interface 171 and a diplexer (duplexer) 177, that couples the transmit signal 155 to the antenna to produce outbound RF signal 170 and couples inbound signal 152 to produce received signal 153. Alternatively, a transmit/receive switch can be used in place of diplexer 177. While a single antenna is represented, the receiver and transmitter may share a multiple antenna structure that includes two or more antennas. In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 125. Each of these antennas may be fixed, programmable, and antenna array or other antenna configuration. Also, the antenna structure of the wireless transceiver may depend on the particular standard(s) to which the wireless transceiver is compliant and the applications thereof.

In operation, the RF transmitter 129 receives outbound data 162. The transmitter processing module 146 packetizes outbound data 162 in accordance with a millimeter wave protocol or wireless telephony protocol, either standard or proprietary, to produce baseband or low intermediate frequency (IF) transmit (TX) signals 164 that includes an outbound symbol stream that contains outbound data 162. The baseband or low IF TX signals 164 may be digital baseband signals (e.g., have a zero IF) or digital low IF signals, where the low IF typically will be in a frequency range of one hundred kilohertz to a few megahertz. Note that the processing performed by the transmitter processing module 146 can include, but is not limited to, scrambling, encoding, puncturing, mapping, modulation, and/or digital baseband to IF conversion.

The up conversion module 148 includes a digital-to-analog conversion (DAC) module, a filtering and/or gain module, and a mixing section. The DAC module converts the baseband or low IF TX signals 164 from the digital domain to the analog domain. The filtering and/or gain module filters and/or adjusts the gain of the analog signals prior to providing it to the mixing section. The mixing section converts the analog baseband or low IF signals into up-converted signals 166 based on a transmitter local oscillation.

The radio transmitter front end 150 includes a power amplifier and may also include a transmit filter module. The power amplifier amplifies the up-converted signals 166 to produce outbound RF signals 170, which may be filtered by the transmitter filter module, if included. The antenna structure transmits the outbound RF signals 170 via an antenna interface 171 coupled to an antenna that provides impedance matching and optional bandpass filtration.

The RF receiver 127 receives inbound RF signals 152 via the antenna and antenna interface 171 that operates to process the inbound RF signal 152 into received signal 153 for the receiver front-end 140. In general, antenna interface 171 provides impedance matching of antenna to the RF front-end 140, optional bandpass filtration of the inbound RF signal 152.

The down conversion module 142 includes a mixing section, an analog to digital conversion (ADC) module, and may also include a filtering and/or gain module. The mixing section converts the desired RF signal 154 into a down converted signal 156 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a baseband or low IF signal 156 that includes a inbound symbol stream. Note that the ordering of the ADC module and filtering and/or gain module may be switched, such that the filtering and/or gain module is an analog module.

The receiver processing module 144 processes the baseband or low IF signal 156 in accordance with a millimeter wave protocol, either standard or proprietary to produce inbound data 160. The processing performed by the receiver processing module 144 can include, but is not limited to, digital intermediate frequency to baseband conversion, demodulation, demapping, depuncturing, decoding, and/or descrambling.

In an embodiment of the present invention, receiver processing module 144 and transmitter processing module 146 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 144 and transmitter processing module 146 are shown separately, it should be understood that these elements could be implemented separately, together through the operation of one or more shared processing devices or in combination of separate and shared processing.

Further details including optional functions and features of the RF transceiver are discussed in conjunction with FIGS. 4-11 that follow.

Figure 4:
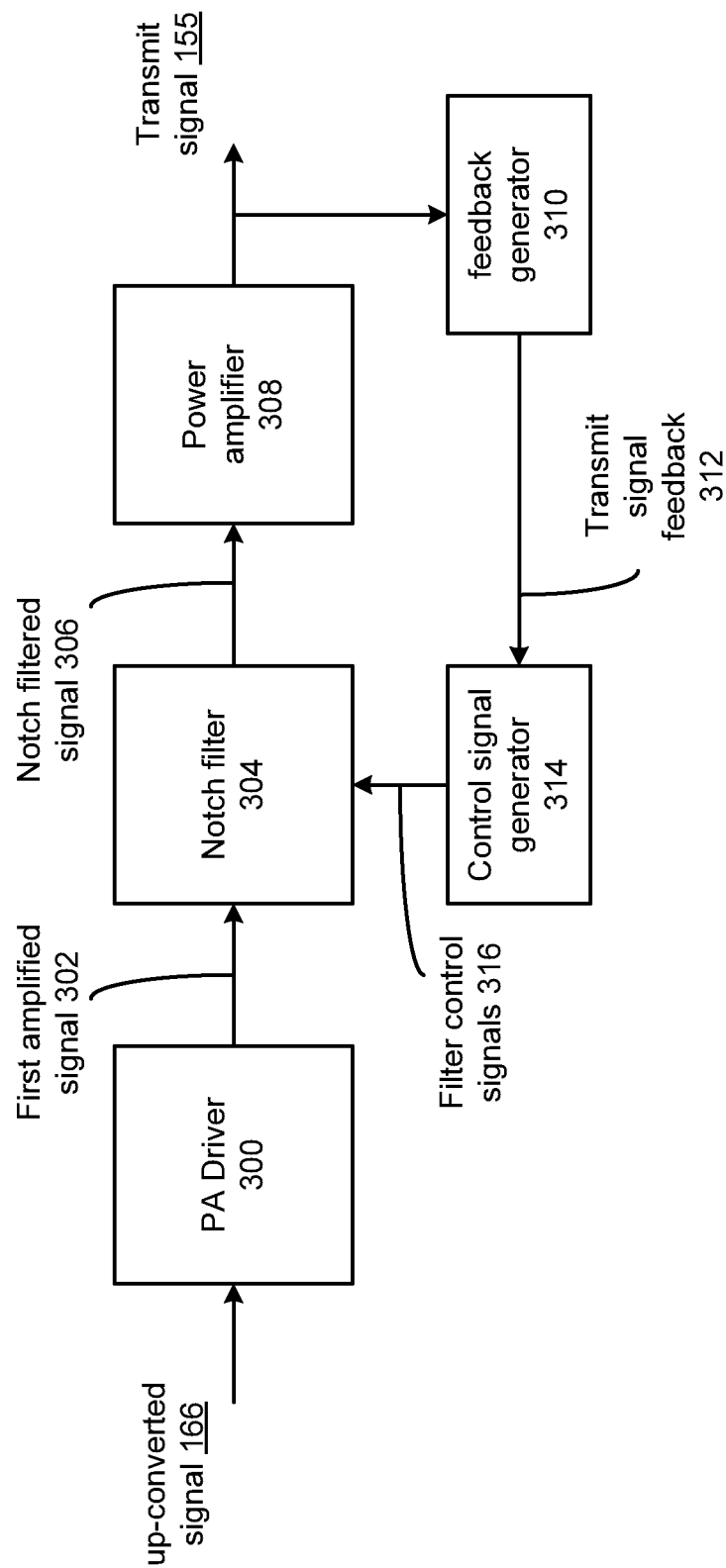
FIG. 4 is a schematic block diagram of an embodiment of a radio transmitter front end in accordance with the present invention.

FIG. 4 is a schematic block diagram of an embodiment of a radio transmitter front end in accordance with the present invention. In particular, a radio transmitter front end, such as radio transmitter front end 150, generates a transmit signal 155 from the up-converted signal 166. Out-of-band noise of RF transmitter output needs to be small enough not to degrade the receiver performance of other bands/standards.

The radio transmitter front end includes at least one amplification stage, such as the two stages of amplification shown as power amplifier driver 300, and power amplifier 308. Out-of-band noise of the RF transmitter output needs to be small enough not to degrade the receiver performance of other bands/standards. The notch and in-band frequencies are tunable using switched capacitors.

On top of any existing band-pass characteristic of the transmitting path, extra noise filtering for a particular band is achieved by using a high Q (quality), passive notch filter 304. In particular, notch filter 304 is included to generate a notch filtered signal 306 from the first amplified signal 302. The notch filter 304 is programmable based on filter control signals 316 generated by control signal generator 314 based on transmit signal feedback 312 generated by transmit feedback generator 310. In particular, transmit feedback generator 310 generates a transmit signal strength indicator (TSSI) or other indication of signal strength, signal to noise ratio or out of band signal rejection. The proper filter control signals 316, such as digital tuning codes or other control signals are generated to adjust the notch frequency after scanning the frequency response and measuring the transmit signal feedback 312. The architecture and component values are selected not to affect the in-band response, but to filter noise at the particular band of interest. The location of the notch filter in the transmitter chain is selected so that its effect on the transmitter gain is minimized.

The circuit operates to detect the frequency response near the notch frequency using loop-back signals, and generate the filter control signals 316 to control the notch frequency of the notch filter 304. While transmit signal feedback 312 is generated via TSSI generator 310 as shown, the normal RX path can be used for the source of this feedback. Notch and in-band frequencies are then adjusted by switched capacitors included in the notch filter 304.

Calibrating the notch/in-band frequencies, adding the digital programming capability for the strength of Q enhancement, and locating the notch filter properly in TX chain allow much flexibility in a wide variety of radios.

Figure 5:
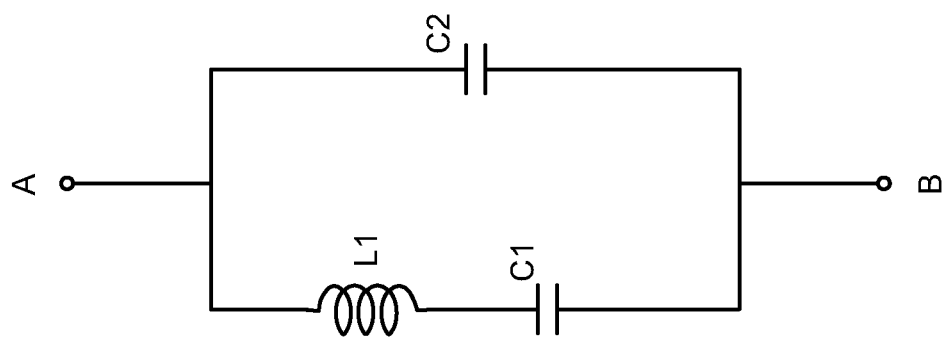
FIG. 5 is a schematic block diagram of an embodiment of a notch filter in accordance with the present invention.

FIG. 5 is a schematic block diagram of an embodiment of a notch filter in accordance with the present invention. A notch filter is shown with a single inductor L1 and two capacitors C1 and C2 that are adjustable based on the filter control signals 316 to filter in out of band noise, while passing the in-band frequencies of interest to the RF transceiver. The circuit generates a low-impedance, Zmin, at a notch frequency set to correspond to the frequency of the out of band TX noise and generates a high-impedance, Zpeak, at a selected in-band frequency.

The circuit can be implemented in a differential configuration or in a single-ended configuration with one terminal grounded. The resonant frequency of the series tank (L1-C1) determines the notch frequency. The value of C2 impacts the in-band impedance peak. It should be noted that the capacitor C2 can be implemented via a special any existing or parasitic capacitance. Assuming that the quality (Q) of capacitors is high, the quality (Q) of the inductor L1 determines the rejection ratio, |Zpeak|/|Zmin|.

In accordance with three different examples of a transmitter used in an implementation of an 802.11ac WLAN device, the table below presents sample values of the circuit components for different notch and inband frequencies.

|  | Notch freq. | Inband freq. | L1 | Q of L1 | C1 | C2 |
| --- | --- | --- | --- | --- | --- | --- |
| case1 | 2 GHz | 2.5 GHz | 2.5 nH | 15 | 2.5 pF | 4.8 pF |
| case2 | 1.7 GHz | 2.5 GHz | 2.5 nH | 15 | 3.51 pF | 3.05 pF |
| case3 | 1.4 GHz | 2.5 GHz | 2.5 nH | 15 | 5.17 pF | 2.34 pF |

Figure 6:
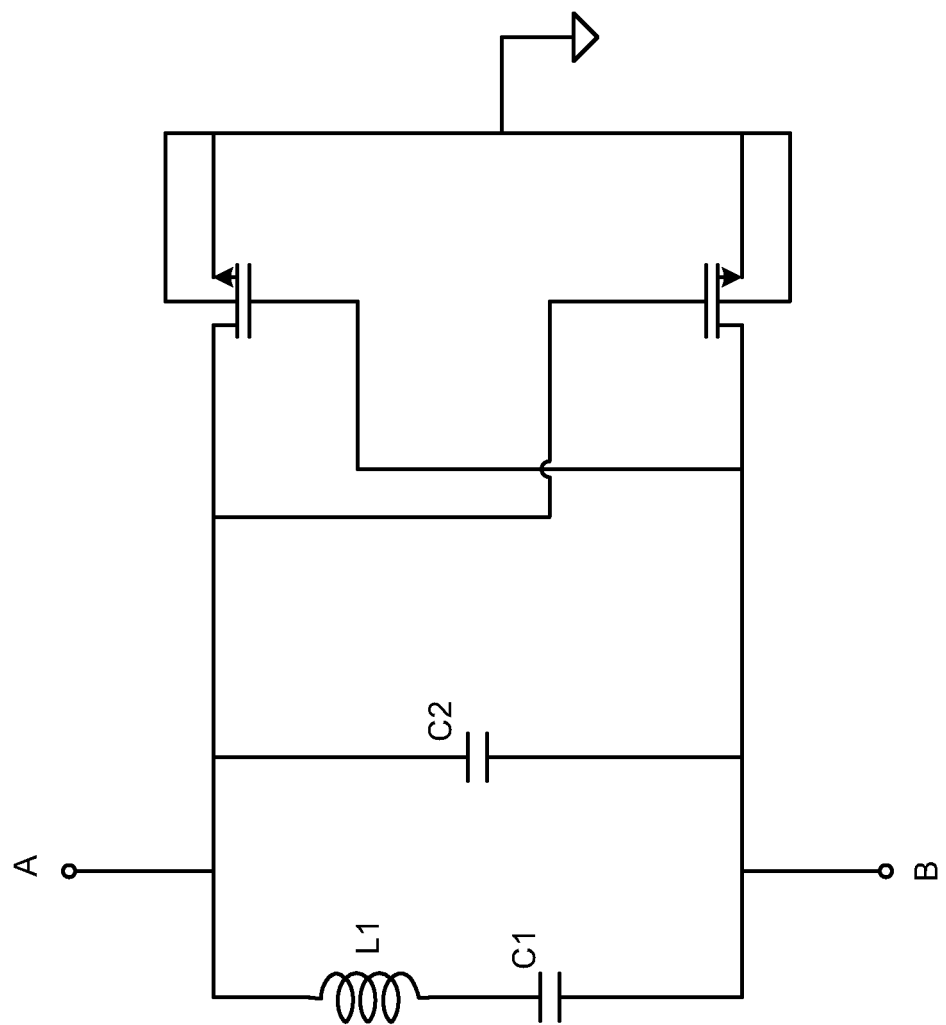
FIG. 6 is a schematic block diagram of an embodiment of a notch filter in accordance with the present invention.

FIG. 6 is a schematic block diagram of an embodiment of a notch filter in accordance with the present invention. In this embodiment negative transconductance is added via the circuit with transistors T1 and T2 to improve the filter Q and its strength is digitally controlled to prevent potential oscillation and minimize linearity degradation.

This Q enhancement circuit is added to, for example, boost the rejection ratio. The strength of Q enhancement can be tunable in response to the filter control signals 316, to compromise between the rejection ratio and the circuit linearity. For example, the gains of the transistors T1 and T2 can be adjustable based on filter control signals 316 to adjust the amount of Q enhancement. The value of L1 can be chosen so that impact on in-band impedance is minimized. Where the impedance is low a small value of L1 may be preferred.

Figure 7:
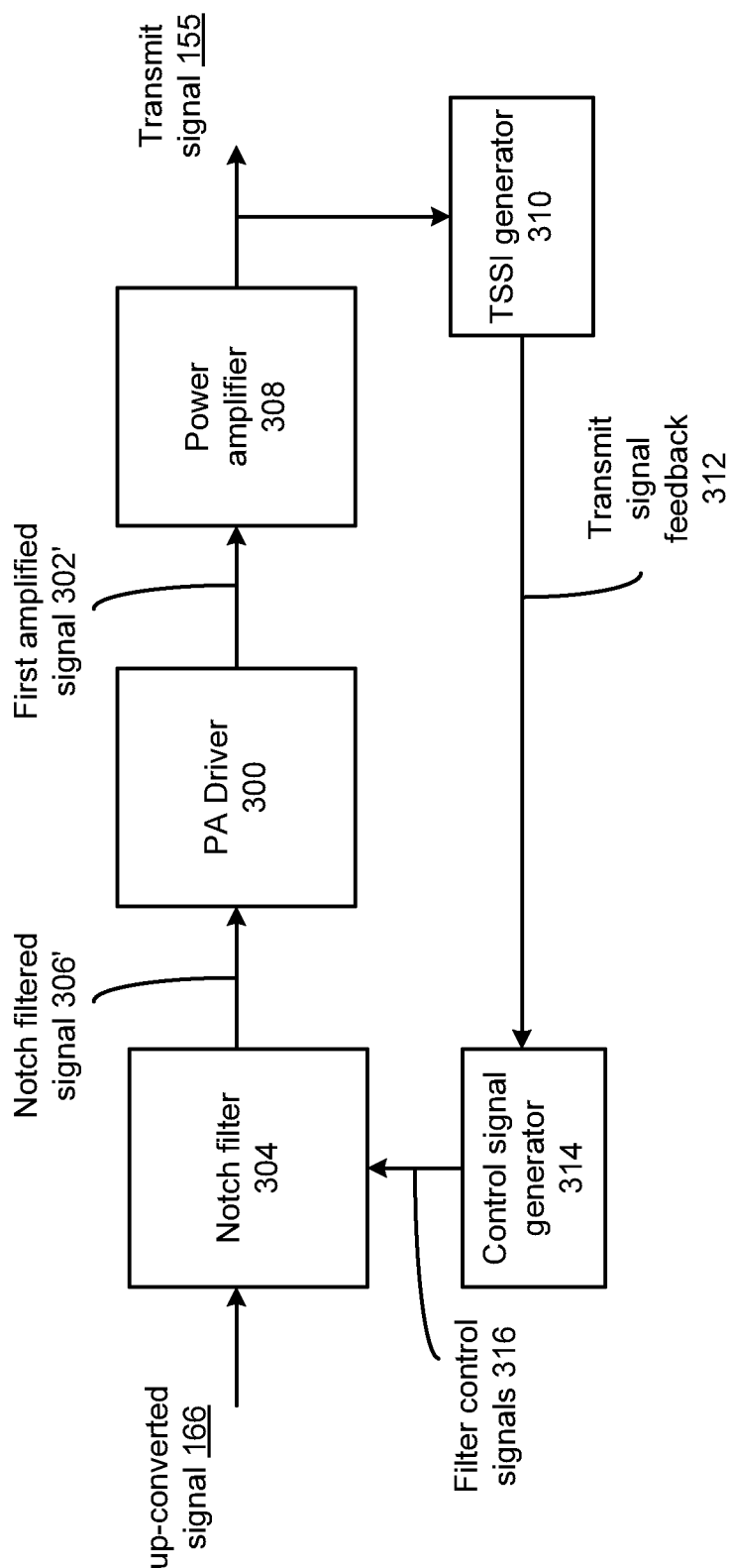
FIG. 7 is a schematic block diagram of an embodiment of a radio transmitter front end in accordance with the present invention.

FIG. 7 is a schematic block diagram of an embodiment of a radio transmitter front end in accordance with the present invention. In this embodiment the notch filter 304 is implemented earlier in the transmit path. This configuration may be preferable due to the low signal swing and improved linearity when using the active Q enhancement circuits. Locating the notch filter 304 later in the transmit path, as shown in FIG. 4 or on the output of the power amplifier 308 out may be preferred to reject noise from the preceding stages.

Figure 8:
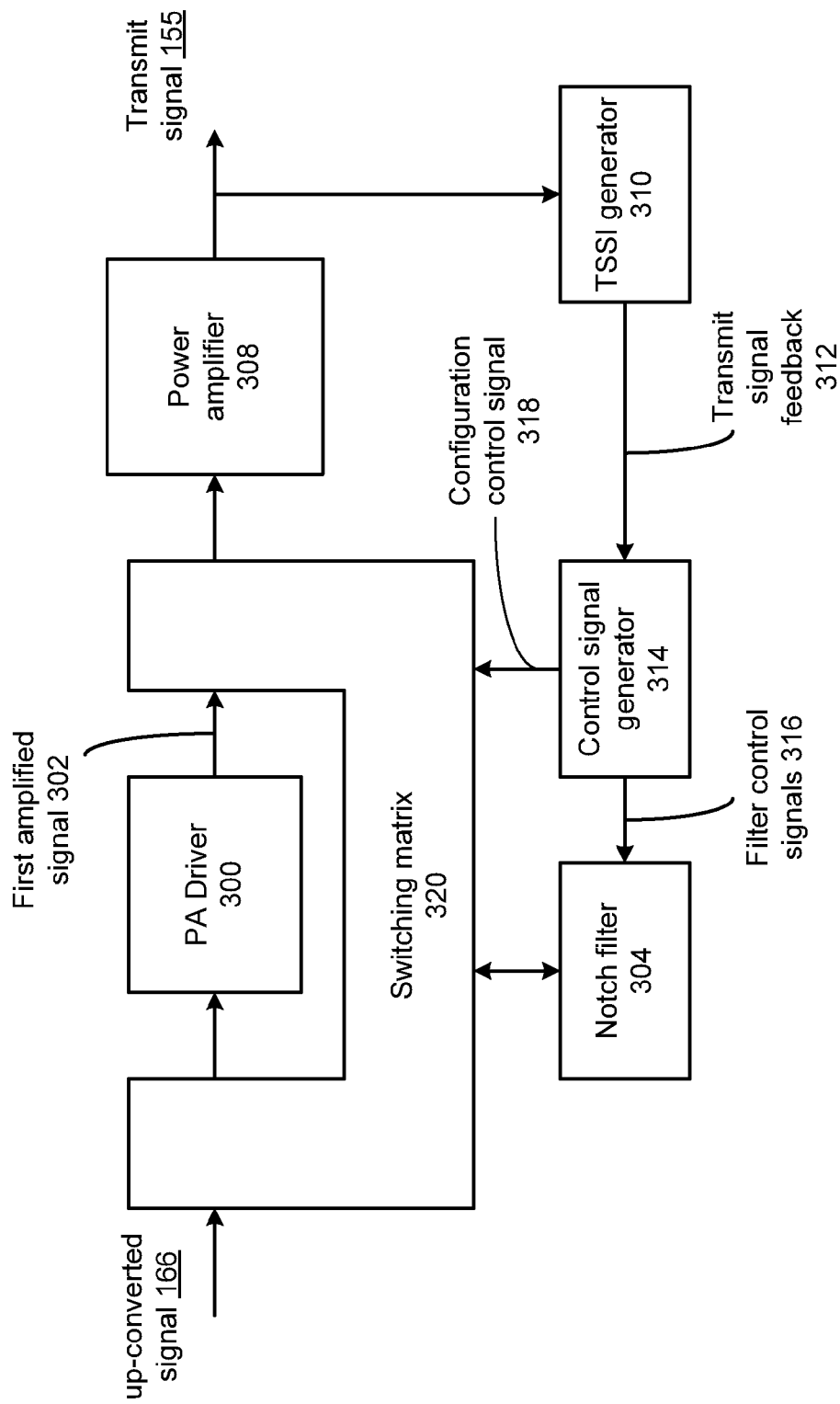
FIG. 8 is a schematic block diagram of an embodiment of a radio transmitter front end in accordance with the present invention.

FIG. 8 is a schematic block diagram of an embodiment of a radio transmitter front end in accordance with the present invention. In particular, in this configuration, switch matrix 320 allows the notch filter 304 to be programmably placed at different locations in the transmit chain, based on the implementation—adding flexibility to the design. In the example shown, the control signal generator 314 not only programs the notch filter 304 via filter control signals 316, but also generates configuration control signal 318 to control the switch matrix 320 to control the placement of the notch filter 304 in the transmit path. For example, for one value of the configuration control signal 318, the switch matrix connects the notch filter 304 in the path before the PA driver 300. In this fashion, the up-converted signal 166 is notch filtered before being input to the PA driver 300, the first amplified signal 302 from the output of the PA driver 300 is connected via switch matrix 320 to the power amplifier 308. For another value of the configuration control signal 318, the switch matrix connects the notch filter 304 in the path after the PA driver 300. In this fashion, the up-converted signal 166 is input to the PA driver 300, and the first amplified signal 302 from the output of the PA driver 300 is notch filtered by notch filter 304 before being input to the power amplifier 308.

Figure 9:
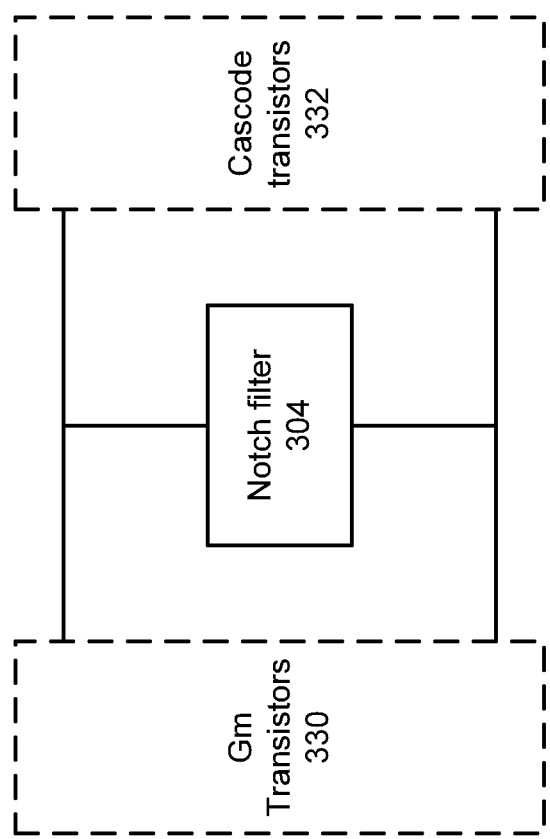
FIG. 9 is a schematic block diagram of an embodiment of a notch filter in accordance with the present invention.

FIG. 9 is a schematic block diagram of an embodiment of a notch filter in accordance with the present invention. It should be noted FIGS. 4 and 7, and 8 present the notch filter in various placements in the transmit path, that other configurations are likewise possible. In particular a notch filter 304 is presented in a cascode amplifier, such as either PA driver 300 or the power amplifier 308. In this configuration, the notch filter 304 is placed between the transconductance transistors 330 and the cascode transistors 332 where both the signal swing and the impedance are typically low.

Figure 10:
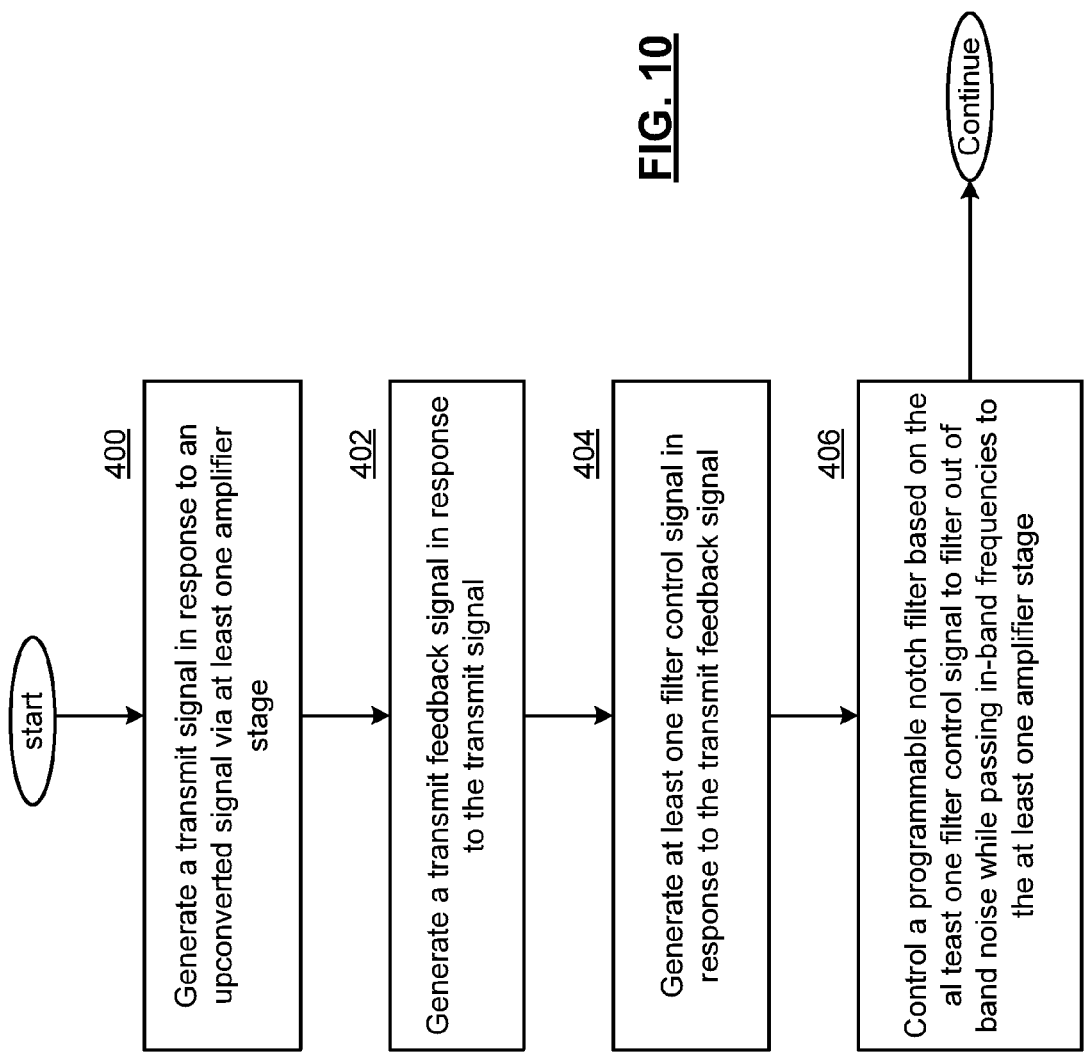
FIG. 10 is a flow diagram of an embodiment of a method in accordance with the present invention.

FIG. 10 is a flow diagram of an embodiment of a method in accordance with the present invention. In particular, a method is shown for use in conjunction with one or more functions and features described in FIGS. 1-9. In step 400, a transmit signal is generated in response to an upconverted signal via at least one amplifier stage. In step 402, a transmit feedback signal is generated in response to the transmit signal. In step 404, at least one filter control signal is generated in response to the transmit feedback signal. In step 406, a programmable notch filter is controlled based on the at least one filter control signal to filter out of band noise while passing in-band frequencies to the at least one amplifier stage.

In an embodiment of the present invention, the transmit feedback signal indicates a transmit signal strength of the in-band frequencies. Step 402 can uses at least a portion of a receive path of a receiver included in the RF transceiver. The at least one amplifier stage can include a power amplifier driver and a power amplifier and the method can further include: coupling the notch filter between the power amplifier driver and the power amplifier; or coupling the notch filter to filter input signals to the power amplifier driver. The at least one amplifier stage can further a switch matrix, and the method can further include controlling the switch matrix to selectively couple the notch filter between the power amplifier driver and the power amplifier to filter input signals to the power amplifier in a first mode of operation; and controlling the switch matrix to selectively couple the notch filter to filter input signals to the power amplifier driver in a second mode of operation.

The at least one amplifier stage can include a cascode amplifier having a plurality of cascode transistors and a plurality of transconductance transistors and the method can further include coupling the notch filter between the plurality of cascode transistors and the plurality of transconductance transistors. The notch filter can includes an inductor and a first capacitor that forms a series tank with the inductor, and a second capacitor in parallel with the series tank, and step 406 can include controlling, via the at least one filter control signal, a capacitance of at least one of: the first capacitor and the second capacitor. The method can also include boosting a quality of the series tank via an active quality (Q) boost circuit having at least one transistor.

Figure 11:
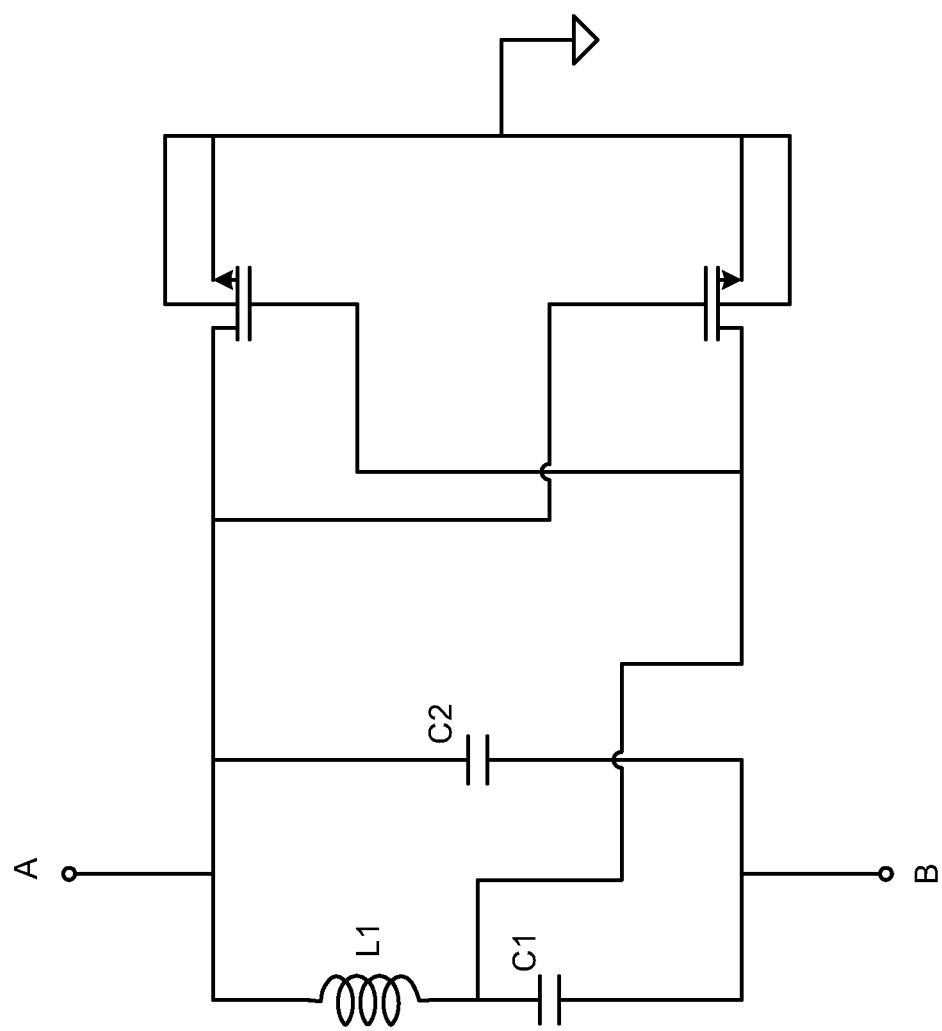
FIG. 11 is a schematic block diagram of an embodiment of a notch filter in accordance with the present invention.

FIG. 11 is a schematic block diagram of an embodiment of a notch filter in accordance with the present invention. In this embodiment negative transconductance is added via the circuit with transistors T1 and T2 to improve the filter Q and its strength is digitally controlled to prevent potential oscillation and minimize linearity degradation.

Like the circuit of FIG. 6, a Q enhancement circuit is added to, for example, boost the rejection ratio. The strength of Q enhancement can be tunable in response to the filter control signals 316, to compromise between the rejection ratio and the circuit linearity. For example, the gains of the transistors T1 and T2 can be adjustable based on filter control signals 316 to adjust the amount of Q enhancement.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The present invention has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of the various embodiments of the present invention. A module includes a processing module, a functional block, hardware, and/or software stored on memory for performing one or more functions as may be described herein. Note that, if the module is implemented via hardware, the hardware may operate independently and/or in conjunction software and/or firmware. As used herein, a module may contain one or more sub-modules, each of which may be one or more modules.

While particular combinations of various functions and features of the present invention have been expressly described herein, other combinations of these features and functions are likewise possible. The present invention is not limited by the particular examples disclosed herein and expressly incorporates these other combinations.

What is claimed is:

1. A radio transmitter front end for use in a radio frequency (RF) transceiver, the radio transmitter front end comprising:
   at least one amplifier stage operable to generate a transmit signal in response to an upconverted signal;
   a feedback generator, coupled to the at least one amplifier stage, operable to generate a transmit feedback signal in response to the transmit signal, by determining an out of band signal rejection of the transmit signal;
   a control signal generator, coupled to the feedback generator, operable to generate at least one filter control signal in response to the transmit feedback signal; and
   a notch filter, coupled to the control signal generator and the at least one amplifier stage, operable to filter out of band noise while passing in-band frequencies to the at least one amplifier stage, under control of the at least one filter control signal.

2. The radio transmitter front end of claim 1 wherein the feedback generator includes a transmit signal strength indicator.

3. The radio transmitter front end of claim 1 wherein the feedback generator includes at least a portion of a receive path of a receiver included in the RF transceiver.

4. The radio transmitter front end of claim 1 wherein the at least one amplifier stage includes a power amplifier driver and a power amplifier and wherein the notch filter is coupled between the power amplifier driver and the power amplifier.

5. The radio transmitter front end of claim 1 wherein the notch filter includes a inductor and a first capacitor that forms a series tank with the inductor, and a second capacitor in parallel with the series tank, wherein a capacitance of at least one of: the first capacitor and the second capacitor is controlled via the at least one filter control signal.

6. The radio transmitter front end of claim 5 wherein the notch filter includes an active quality (Q) boost circuit having at least one transistor, the quality boost circuit coupled to boost a quality of the series tank.

7. The radio transmitter front end of claim 1 wherein the RF transceiver operates in accordance with an 802.11ac standard.

8. A method for use in a radio frequency (RF) transceiver, the method comprising:
   generating a transmit signal in response to an upconverted signal via at least one amplifier stage;
   generating a transmit feedback signal in response to the transmit signal, by determining an out of band signal rejection of the transmit signal;
   generating at least one filter control signal in response to the transmit feedback signal; and
   controlling a programmable notch filter based on the at least one filter control signal to filter out of band noise while passing in-band frequencies to the at least one amplifier stage.

9. The method of claim 8 wherein the transmit feedback signal indicates a transmit signal strength of the in-band frequencies.

10. The method of claim 8 wherein generating the transmit feedback signal uses at least a portion of a receive path of a receiver included in the RF transceiver.

11. The method of claim 8 wherein the at least one amplifier stage includes a power amplifier driver and a power amplifier and the method further comprises:
   coupling the notch filter between the power amplifier driver and the power amplifier.

12. The method of claim 8 wherein the notch filter includes a inductor and a first capacitor that forms a series tank with the inductor, and a second capacitor in parallel with the series tank, and controlling the programmable notch filter can operate by controlling, via the at least one filter control signal, a capacitance of at least one of: the first capacitor and the second capacitor.

13. The method of claim 12 further comprising:
   boosting a quality of the series tank via an active quality (Q) boost circuit having at least one transistor.

14. The method of claim 8 wherein the RF transceiver operates in accordance with an 802.11ac standard.

15. A radio transmitter front end for use in a radio frequency (RF) transceiver, the radio transmitter front end comprising:
   at least one amplifier stage operable to generate a transmit signal in response to an upconverted signal;
   a feedback generator, coupled to the at least one amplifier stage, operable to generate a transmit feedback signal in response to the transmit signal that indicates an amount of out of band noise present in the transmit signal;
   a control signal generator, coupled to the feedback generator, operable to generate at least one filter control signal in response to the transmit feedback signal; and
   a notch filter, coupled to the control signal generator and the at least one amplifier stage, operable to filter out of band noise while passing in-band frequencies to the at least one amplifier stage, under control of the at least one filter control signal.

16. The radio transmitter front end of claim 15 wherein the feedback generator includes a transmit signal strength indicator.

17. The radio transmitter front end of claim 15 wherein the feedback generator includes at least a portion of a receive path of a receiver included in the RF transceiver.

18. The radio transmitter front end of claim 15 wherein the at least one amplifier stage includes a power amplifier driver and a power amplifier and wherein the notch filter is coupled between the power amplifier driver and the power amplifier.

19. The radio transmitter front end of claim 15 wherein the notch filter includes a inductor and a first capacitor that forms a series tank with the inductor, and a second capacitor in parallel with the series tank, wherein a capacitance of at least one of: the first capacitor and the second capacitor is controlled via the at least one filter control signal.

20. The radio transmitter front end of claim 19 wherein the notch filter includes an active quality (Q) boost circuit having at least one transistor, the quality boost circuit coupled to boost a quality of the series tank.

\* \* \* \* \*